United States Patent [19]

Gosney et al.

[11] 3,852,119

[45] Dec. 3, 1974

[54] METAL-INSULATOR-SEMICONDUCTOR STRUCTURES HAVING REDUCED JUNCTION CAPACITANCE AND METHOD OF FABRICATION

[75] Inventors: William Milton Gosney, Richardson, Tex.; Martin George Buehler, Gaithersburg, Md.

[73] Assignee: Texas Instruments Incorporated, Dallas, Tex.

[22] Filed: Nov. 14, 1972

[21] Appl. No.: 306,505

[52] U.S. Cl. .................... 148/1.5, 148/187, 357/20, 357/58, 357/91

[51] Int. Cl. .............................................. H01l 7/54

[58] Field of Search .............. 148/1.5, 187; 317/235

[56] References Cited

UNITED STATES PATENTS

| | | | |
|---|---|---|---|
| 3,362,856 | 1/1968 | White | 148/187 X |
| 3,413,531 | 11/1968 | Leith | 148/1.5 X |
| 3,431,150 | 3/1969 | Dolan et al. | 148/1.5 |
| 3,460,006 | 8/1969 | Strull | 317/235 |
| 3,558,366 | 1/1971 | Lepselter | 148/1.5 |
| 3,595,716 | 7/1971 | Kerr et al. | 148/187 |
| 3,622,382 | 11/1971 | Brack et al. | 148/1.5 X |
| 3,634,738 | 1/1972 | Leith et al. | 148/1.5 X |
| 3,726,719 | 4/1973 | Brack et al. | 148/1.5 |
| 3,745,070 | 7/1973 | Yada et al. | 148/1.5 |

*Primary Examiner*—L. Dewayne Rutledge
*Assistant Examiner*—J. M. Davis
*Attorney, Agent, or Firm*—Harold Levine; James Comfort; Richard Donaldson

[57] ABSTRACT

Metal-insulator-semiconductor structures characterized by reduced junction capacitance and methods of fabrication are disclosed. A substantially intrinsic region beneath the junction is formed by implanting selected ions. The ion implantation does not produce lateral diffusion of conventionally formed junctions, and therefore breakdown and packing density are not changed. The substantially intrinsic region does, however, increase the space charge region of the adjacent junction, thus reducing the effective capacitance. In the preferred method of fabrication, ions are implanted using the same mask employed in forming the p-n junction.

7 Claims, 9 Drawing Figures

METAL-INSULATOR-SEMICONDUCTOR STRUCTURES HAVING REDUCED JUNCTION CAPACITANCE AND METHOD OF FABRICATION

The present invention pertains to metal-insulator-semiconductor structures having reduced junction capacitance and methods for fabrication.

Metal-insulator-semiconductor (MIS) structures are characterized by numerous advantages and are used extensively in the electronics industry. Such structures include insulated gate field effect transistors (IGFET), metal-oxide-semiconductor integrated circuits, and more recently charge transfer devices such as charge-coupled-devices (CCD) and IGFET bucket brigades (BB).

With respect to MIS circuits in general, the limitations on performance are imposed mainly by device gain and load capacitance. To achieve high packing density, the circuits and devices are made as physically small as yield and processing capability allows. Hence, device gain and load capacitance are more or less fixed by physical limitations, and thus capacitive loading effects and circuit switching times are dominated and limited by geometrical constraints of the manufacturing process. If the total load capacitance in an MIS circuit could be reduced, overall performance characteristics would be substantially improved.

More particularly, with respect to the charge transfer structures both bucket brigades and charge-coupled devices offer great potential for developing large capacity semiconductor memories. The inherent simplicity of these device types enables reducing the size per bit to substantially less than 1 square mil, thus offering the capability for building circuits with an order-of-magnitude increase in bit capacity over present designs using existing processing technology and maintaining present bar sizes. However, the greatest limitation to minimum bit size is not processing technology. Instead, capacitive loading of the information by the data regenerator (and output amplifier) input gates reduces the dynamic voltage range of the data. Thus, for a given process technique and regenerator design, there is a minimum bit size below which capacitive loading of the charge detector reduces voltage swing to a point at which the detector will not function. The signal voltage is given approximately by:

$$V/E = C_s/(C_s + C_j)$$

where — V is the signal amplitude, E is the clock voltage, $C_s$ is the thin oxide storage capacitance of the bit, and $C_j$ is the junction capacitance of the bit, plus that of the detector input gate and junction contact. As bit size is reduced, $C_j$ becomes relatively large compared to $C_s$, and V may become too small to give reliable triggering of the detector stages. There will always be some capacitve loading by the output and regenerator detectors because layout and design restrictions require the last stage of a BB or CCD shift register to be large enough to accommodate a metal to silicon contact. This extra junction capacitance, plus that of the sensing device gate will add a loading capacitance that cannot be improved except by making the device physically smaller. But the overall junction capacitance can be reduced by reducing the junction capacitance per unit area, permitting a smaller minimum bit size or improving dynamic voltage range.

Junction capacitance can be decreased by using a higher resistivity, (lower doping) substrate. This, however, results in a reduced packaging density due to the increase in the peripheral space-charge width.

Accordingly, an object of the present invention is the provision of a MIS structure having reduced load capacitance.

A further object of the invention is the provision of a method for reducing the junction capacitance in a metal-insulator-semiconductor structure.

Yet another object of the invention is a method for fabricating a charge transfer device circuit characterized by extremely low junction capacitance.

An additional object of the invention is a method of fabricating a charge transfer device circuit on a substrate having a relatively low resistivity such that such circuit is characterized by low capacitance p-n junctions.

Briefly, in accordance with the invention, a process is provided for fabricating a MIS structure having at least one p-n junction extending from the surface of the substrate and characterized by relatively low capacitance. A mask is formed on the surface of a semiconductor substrate of preselected conductivity type and resistivity. An aperture is opened in the mask to expose a region of the substrate surface where a p-n junction is required. The exposed surface region is doped by conventional techniques such as diffusion through the apertured mask to form a pocket of opposite conductivity type material having substantially vertical side walls and substantially planar bottom boundary. The body of opposite conductivity material defines a p-n junction with the substrate, the p-n junction having a corresponding space charge region determined by the respective resistivities of the pocket and the substrate. The space charge region corresponding to the bottom boundary between the pocket and substrate is subsequently extended by bombarding the exposed region of the substrate, through the apertured mask, with ions effective to compensate the majority carriers of the substrate. The ions are accelerated by sufficient voltage to penetrate through the doped region of opposite conductivity type and become embedded in the substrate in a layer extending into the substrate from the bottom boundary of the pocket of opposite conductivity type material. In this substrate layer where the ions become embedded, the majority carriers are substantially compensated and the layer becomes substantially intrinsic. This is effective to increase the space charge region and reduce the junction capacitance. Since the accelerated ions penetrate vertically with very little laterial spread, the space charge region corresponding to the side walls of the pocket remains unchanged, enabling maintenance of a high device packing density previously unobtainable with comparable p-n junction capacitance.

Preferably, the MIS structure is annealed subsequent to the ion bombarding step to repair crystal lattice damage resulting from the ions traversing the semiconductor material.

In a preferred embodiment of the invention, a charge-coupled device shift register having high packing density and relatively low load capacitance is provided. The shift register includes a number of substantially parallel spaced apart electrodes which are defined on a relatively thin insulating layer which in turn overlies a semiconductor substrate. Multiphase clocks are connected to the electrodes to generate "potential" wells in the substrate surface and effect shift register fashion transfer of electrical charge. The signal is detected at the output of the shift register by a pocket of opposite conductivity type material which extends from the surface of the substrate in p-n junction forming relation. The side walls of the pocket are substantially parallel with the substrate surface. The p-n junction capacitance is relatively large, since the substrate is generally of relatively low resistivity. In accordance with the present invention, however, the p-n junction capacitance is materially reduced by forming a substantially intrinsic semiconductor layer adjacent the bottom boundary of the pocket of opposite conductivity type material, enabling an increase in packing density and circuit speed.

In further embodiments of the invention an insulated-gate-field-effect transistor bucket brigade having reduced load capacitance and CMOS circuits having increased circuit speed are provided.

Further objects and advantages of the invention will be apparent upon reading the following detailed description of illustrative embodiments in conjunction with the drawings wherein:

FIGS. 1*a*–1*c* are cross-sectional views of a substrate illustrating a method of fabricating a metal-insulator-semi-conductor structure in accordance with one embodiment of the invention;

FIGS. 2*a*–2*c* are cross-sectional views of a substrate illustrating an alternate fabricating method;

Figure 1A:
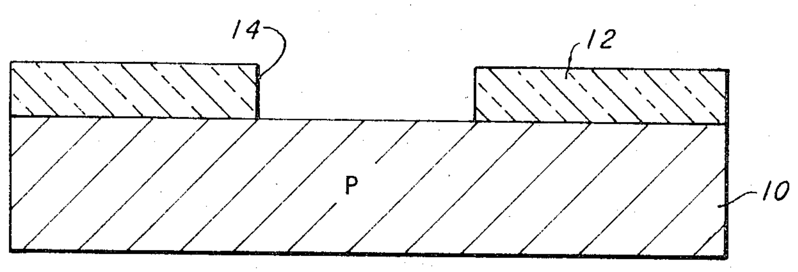
Figure 1B:
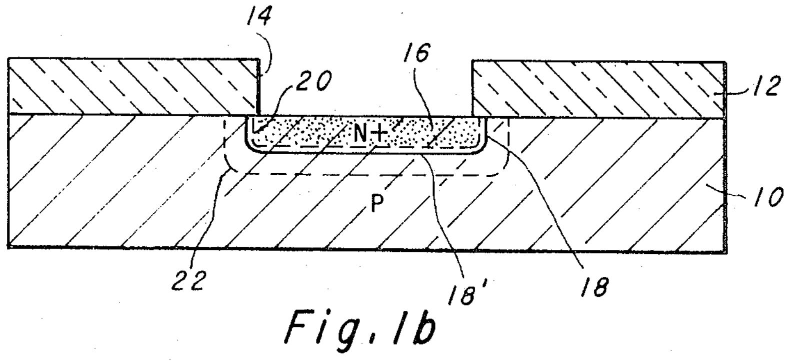
Figure 1C:
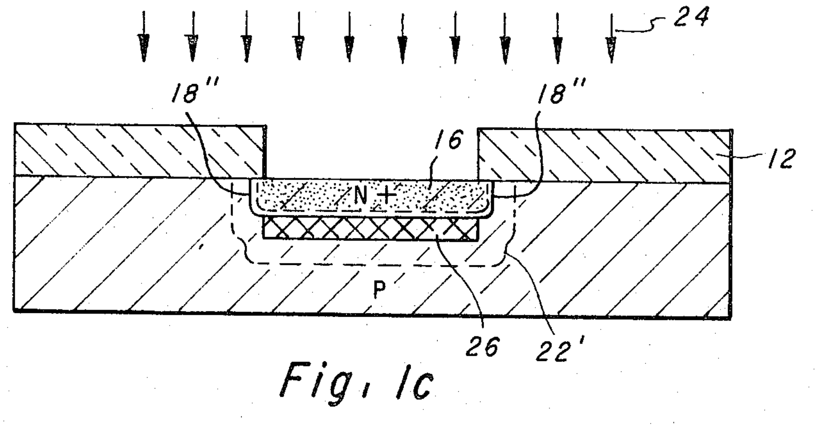

With reference now to the drawings, and for the present to FIGS. 1*a*–1*c*, there is depicted, at various stages of fabrication, a metal-insulator-semiconductor structure in accordance with a preferred embodiment of the invention. The process begins with a semiconductor substrate 10 of selected conductivity type and resistivity. Silicon is a preferred substrate. A suitable insulating layer 12, such as silicon oxide, is formed over the surface of the substrate 10. Typically, layer 12 may be on the order of 10,000 A of silicon oxide. An aperture 14 is opened in layer 12 to expose a portion of the substrate surface. Conventional techniques such as photo lithographic mask and etch can be used to form the aperture 14. Next, a region 16 of conductivity type opposite that of the substrate 10 is formed using conventional techniques such as diffusion. A p-n junction 18 is defined between the region 16 and the substrate 10. Other suitable techniques for forming the p-n junction 18 may of course be utilized.

As shown, the region 18 has side wall boundaries which extend the p-n junction to the surface of the substrate 10. The side walls are substantially vertical and terminate in a bottom boundary 18' which is substantially planar and parallel to the substrate surface.

The space charge region, i.e., depletion region, corresponding to the junction 18 is shown enclosed by the dashed lines 20 and 22. It can be seen that the space charge portion in the substrate side of the junction 18 is considerably wider than that in the region 16, since the substrate has a higher resistivity than the region 16. The MIS structure at this stage is shown in FIG. 1*b*.

In the next step the structure is exposed to an ion beam shown generally by the arrows 24. The ions are chosen to be of a conductivity type which will compensate the substrate dopant. The insulating layer 12 serves as a mask adjacent the ion beam 24. Thus, only ions in the region of the aperture 14 strike the substrate surface. Preferably, the original layer 12 used for forming the doped region 16 is used as the ion mask. If desired, however, a new mask can be utilized for the implant step.

The ion beam 24 is accelerated sufficiently to implant the ions near the junction portion 18'. The substrate is exposed to the beam 24 for a sufficient time such that the implanted ions substantially compensate the substrate donors in a layer adjacent junction 18', creating a substantially intrinsic layer 26. It will be seen that any reduction in free charge carriers in the region 26 will reduce junction capacitance. Preferably, however, the region 26 is compensated to near intrinsic, i.e., exhibit a resistivity at least on the order of magnitude higher than the resistivity of the substrate 10. Typically, acceleration voltages on the order of 150 kev with a total dosage of about $10^{11}$ to $10^{12}$ ions per square cm. are effective to produce a near intrinsic region at a depth of about 6,000 A in a silicon substrate having an initial doping level on the order of $10^{15}$ per cm.

Compensating the free charge carriers in the substrate 10 in the region 26 is effective to widen the space charge region as shown at 22' (FIG. 1c). This effectively reduces the total junction capacitance of the junction 18 and enables increased circuit speed as compared to similar structures which are not compensated by the implant step. Subsequent to implanting, the structure is generally annealed at temperatures on the order of 800° C. Higher temperatures may be used, but result in additional diffusion of impurities in the region 16. Ohmic (metal) contacts (not shown) can be made to the region 16 by conventional techniques or metallization over the layer 12 can be effected to complete the MIS structure. As may be seen with reference to FIG. 1*c*, the implant step does not substantially affect the space charge region associated with the side walls 18' of the region 16. This is advantageous in that total junction capacitance is reduced without reducing packing density or breakdown voltage.

Figure 2A:
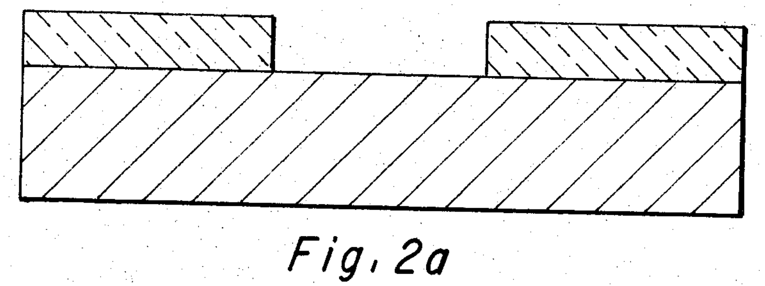
Figure 2B:
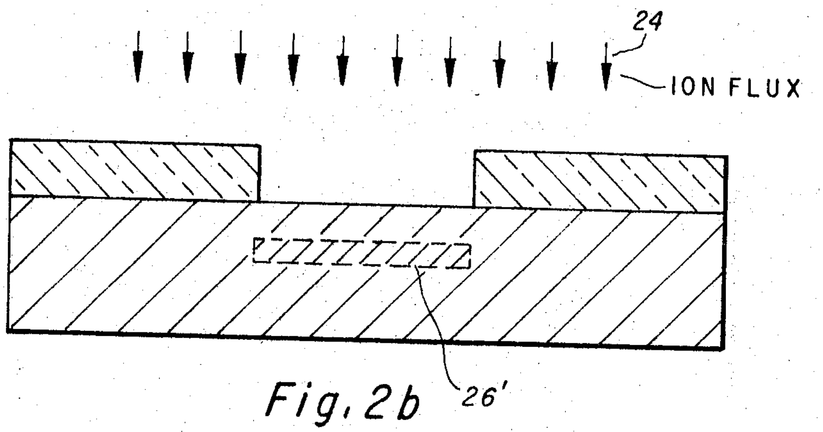
Figure 2C:
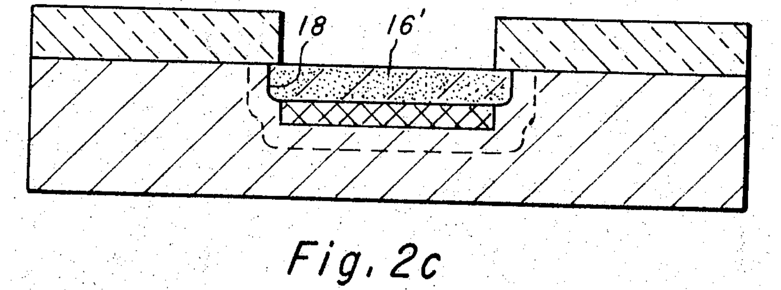

With reference to FIGS. 2*a*–2*c* an alternative process in accordance with the invention is depicted. The process is similar to that described with reference to FIGS. 1*a*–1*c*, except that the substantially intrinsic region 26' (FIG. 2b) is formed by the ion beam 24 prior to the step of forming the *p-n* junction 18. This embodiment is advantageous in that when the region 16' (FIG. 2*c*) is formed by diffusion, annealing automatically takes place.

Figure 3:
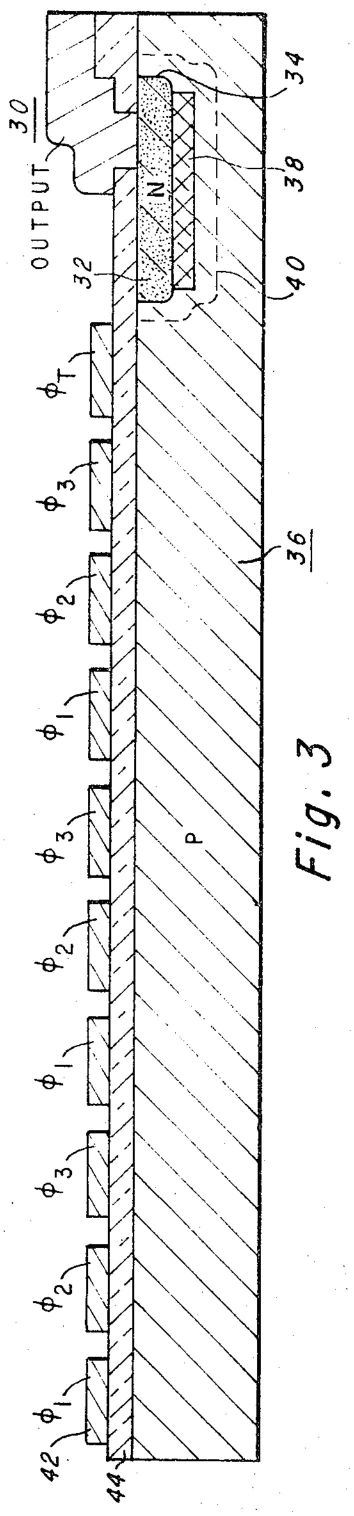
FIG. 3 is a cross-sectional view illustrating a charge-coupled-device shift register having reduced load capacitance in accordance with the invention.

With reference now to FIG. 3, it may be seen that the process of the present invention finds advantageous application in fabricating a CCD shift register wherein packing density and circuit speed are maximized by reducing total load capacitance. At this juncture, it might first be noted that charge-coupled devices are metal-insulator-semiconductor devices which belong to a general class of semiconductor charge devices which store and transfer information in the form of electrical charge. The charge-coupled devices are distinguished by the property that the semiconductor portion of the devices is, for the most part, homogeneously doped, regions of different conductivity being required only for injecting or extracting charge. A typical semiconductor charge-coupled device shift register is described, for example, in Boyle et al, *Bell System Technical Journal*, 49,587 (1970). In the shift register, a DC bias sufficient to invert the semiconductor surface is applied between electrodes, and the semiconductor material and clocking pulses are applied sequentially to the electrodes. Because of the inversion, semiconductor surface minority carriers are drawn to the semiconductor-insulator interface and tend to collect in the potential wells under the electrode. When the clocking pulses are sufficiently large, the minority carriers migrate from the area under one electrode to the area under the next following a potential well produced by the clocking pulses.

As noted previously, a limiting factor on minimum bit size in a CCD structure is capacitive loading of the charge detector. With reference to FIG. 3, a charge detector is shown generally in the region 30 and includes a region of opposite conductivity material 32. The region 32 defines a p-n junction 34 with the substrate 36. A substantially intrinsic layer 38 beneath the bottom boundary of the junction is effective to extend the space charge region, shown at 40, to reduce junction capacitance. This region 38 is advantageously defined by ion implantation as previously described. Operation of CCD shift registers and general fabrication techniques are known in the art and need not be included in detail herein. In brief, it is noted that a three phase CCD shift register is depicted. The three phase clocks are connected to electrodes 42 which are separated from the semiconductor substrate 36 by a thin insulating layer 44 such as silicon dioxide, which may typically be on the order of about 500 A – 2,000 A in thickness. As illustrated, a transfer electrode $\phi_T$ is used to transfer charge from the last bit of the shift register to the charge detector 30.

Figure 4:
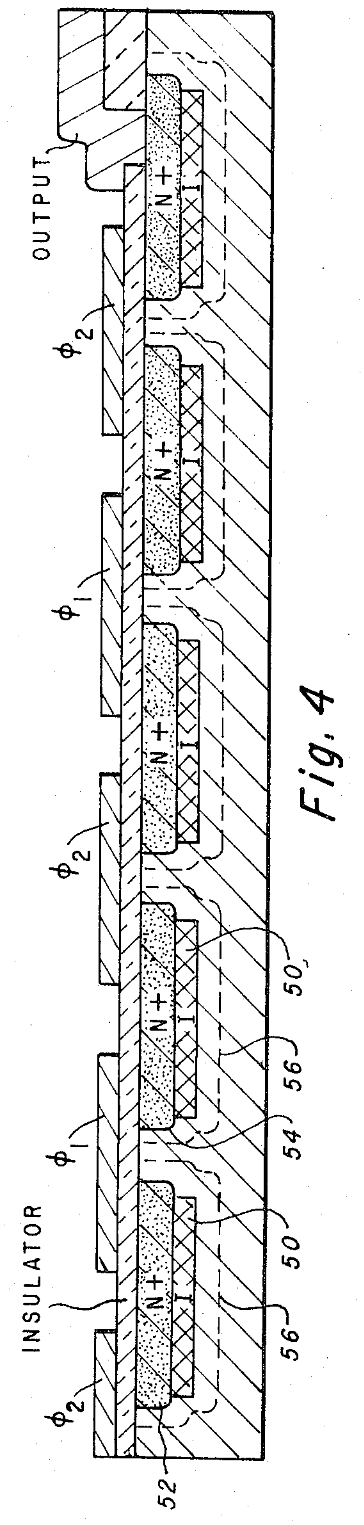
FIG. 4 is a cross-sectional view illustrating a portion of an insulated gate field effect transistor bucket brigade in accordance with the invention.

With reference now to FIG. 4, an insulated gate field-effect transistor bucket brigade is depicted. Fabrication and operation of bucket brigade shift registers are well known in the art and need not be described in detail herein. The structure of FIG. 4 differs from conventional bucket brigades in that substantially intrinsic regions, shown generally at 50 are defined adjacent the bottom boundary of the source and drain diffusions shown generally at 52 and 54. These intrinsic regions are advantageously defined by ion implantation and are effective to extend the space charge regions, shown generally at 56, to reduce total load capacitance and enable substantially increased circuit performance.

Figure 5:
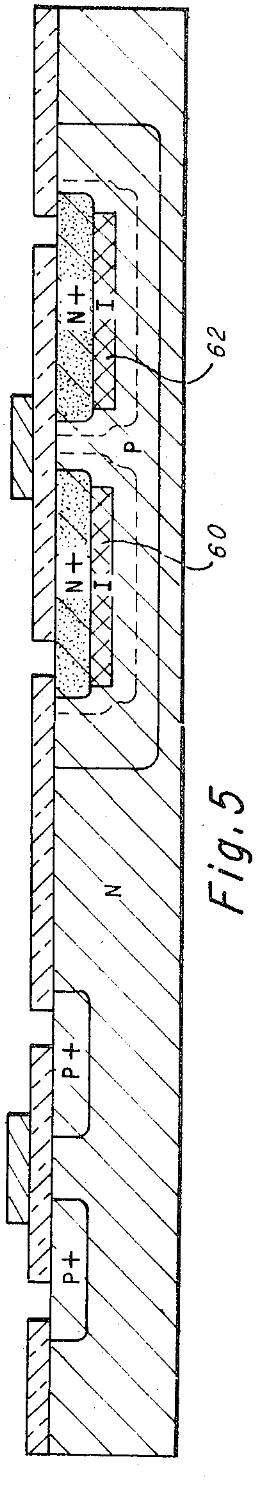
FIG. 5 is a cross-sectional view of a complementary MOS structure having reduced junction capacitance in accordance with the invention.

With reference now to FIG. 5, a complementary metal-oxide-semiconductor structure in accordance with the invention is depicted. While the present invention applies to MIS structures in general and is effective to reduce load capacitance associated therewith, particular advantage is realized with respect to the CCD and BB configurations previously described, and to COS structures as depicted in FIG. 5. The invention is particularly effective with respect to CMOS structures due to the high doping concentration in the n channel device (right hand side of FIG. 5) and in a preferred embodiment substantially intrinsic layers 60 and 62 are defined under the p-n source and drain junctions only by the n channel device. The effectiveness of the present invention in a typical CMOS integrated circuit inverter driving another similar inverter can more readily be appreciated by considering the time constant $\tau$ associated with MIS transient response, which is given by:

$$\tau = C_L/g_m$$

where $C_L$ is the total load capacitance, $g_m$ is the gain of the device (determined by gate voltage, oxide thickness, channel mobility, and channel aspect ratio). The ion implantation will not affect $g_m$.

Further, $$C_L = C_{jp} + C_{jn} + C_g + C_i$$

where $C_i$ is the capacitance of the metal interconnect pattern (not changed by ion implantation).

$C_g$ is the total capacitance of the gates of all circuitry comprising the load to the stage (again, this is independent of ion implantation).

$C_{jp}$ and $C_{jn}$ are the capacitances of the p- and n-channel device drain diffusions which are both voltage dependent and are reduced by the ion implantation technique. Thus, a reduction of the total load capacitance will result in a corresponding increase in frequency performance. In a typical CMOS type inverter driving another similar inverter, typical capacitance values are shown in TABLE I.

TABLE I

| All values in pf | $C_{jp}$ | $C_{jn}$ | $C_g$ | $C_i$ | $C_L$ |
|---|---|---|---|---|---|
| Before ion implantation | .2 | .7 | .12 | .1 | 1.12 |
| After ion implantation | .2 | .2 | .12 | .1 | .62 |

The most improvement to junction capacitance affects occurs with more heavily doped junctions having narrow space-charge regions. There will be less improvement to the p-channel devices ($C_{jp}$ substantially unchanged) but the n-channel devices exhibit nearly a three-fold decrease in drain junction capacitance ($C_{jn}$ changes from 0.7 to 0.2). The overall effect on switching speed can be improved by as much as a factor of 2 or more, depending upon the relative contribution of n-channel drain junction capacitance to total load capacitance.

While the present invention has been described in detail with respect to illustrative embodiments, it will be apparent to those skilled in the art that various modifications may be made without departing from the spirit and scope of the invention.

What is claimed is:

1. In a process for fabricating a metal-insulator-semiconductor structure having at least one p-n junction extending from a surface of a semiconductor substrate and characterized by relatively low capacitance, the steps of:

a. forming a mask on the surface of a semiconductor substrate of one conductivity type, said mask defining an aperture exposing a first region of said substrate;

b. introducing doping impurities of opposite conductivity type through said aperture into said first region to form in said substrate, a pocket of said opposite conductivity type having a bottom boundary substantially parallel to said surface and side walls substantially perpendicular to said surface so that said pocket defines a p-n junction with said substrate extending along said boundary and is characterized by a space-charge region defined by the relative doping levels of said pocket and said substrate, and c. introducing doping impurities into said substrate only into a second region adjacent to said bottom boundary of the pocket, said impurities being introduced in quantity sufficient to produce at least partial conductivity type compensation of said substrate material in said second region and thereby reduce the capacitance of said p-n junction by reducing the width of said space-charge region along said bottom boundary while leaving the width of said space-charge region along said lateral boundary substantially unchanged.

2. A process as set forth in claim 1, wherein the said step (*c*) is effected by introducing said impurities into said second region of the substrate in a quantity sufficient to convert said second region into a substantially intrinsic layer.

3. A process as set forth in claim 2, wherein the step of forming said substantially intrinsic layer is characterized by bombarding said first region through said aperture with preselected ions of a sufficient energy and dosage to implant said ions in said substrate to compensate the majority carriers of said substrate only in said second region immediately beneath said bottom boundary.

4. In a method for fabricating a metal-insulator-semiconductor structure, the steps comprising:

a. forming an insulating layer on the surface of a semiconductor substrate doped with dopant of one conductivity type;

b. opening an aperture in said insulating layer to expose a preselected region of said substrate;

c. introducing doping impurities of opposite conductivity type into said preselected region through said aperture, to form a body of opposite conductivity type material extending into the substrate transversely of said substrate surface to define a p-n junction between said body and said substrate, said p-n junction having a space-charge region associated therewith; and d. exposing said insulating layer to a beam of ions for compensating said one conductivity type dopant, said ions having sufficient energy and dosage to penetrate into said substrate only through said aperture and form a substantially intrinsic layer in said substrate only immediately adjacent the bottom boundary of said body of opposite conductivity type, thereby extending the depth of said space-charge region from said bottom boundary and significantly reducing p-n junction capacitance between said body and said substrate at said bottom boundary.

5. A method as set forth in claim 4 including the step of annealing the resultant structure at temperatures less than about 1,000° C.

6. In a method for fabricating a metal-insulator-semiconductor structure, the steps comprising:

a. forming an insulating layer on the surface of a semiconductor substrate doped with dopant of one conductivity type;

b. opening an aperture in said layer to expose a preselected region of said substrate;

c. bombarding said exposed region with a preselected beam of ions compensatory of said one conductivity type dopant, said ion beam having an energy sufficient to implant said compensatory ions in a layer a preselected distance beneath the surface of said exposed region, said ions being implanted with a dosage sufficient to define a subsurface layer of substantially intrinsic semiconductor material in said substrate, said layer extending substantially parallel to said surface of said substrate; and then d. introducing impurities of conductivity type opposite from that of said one conductivity type into said exposed region to form a body of said opposite conductivity type material in said substrate, which body extends from said surface thereof and has a bottom boundary contacting said substantially intrinsic layer and a lateral boundary extending to said substrate surface thereby defining a p-n junction along said boundaries, said p-n junction having an extended width and reduced p-n junction capacitance along said bottom boundary.

7. A method as set forth in claim 6 wherein the step of forming said body of opposite conductivity type material is characterized by diffusing impurities of said opposite conductivity type through said aperture into said region at temperatures sufficiently high to anneal said substrate in the areas thereof traversed by said ion beam.

* * * * *